US012795828B2

(12) United States Patent
Kong et al.

(10) Patent No.: US 12,795,828 B2
(45) Date of Patent: Nov. 10, 2026

(54) FOLDABLE COMPRESSION ATTACHED MEMORY MODULE (fCAMM)

(71) Applicant: Intel Corporation, Santa Clara, CA (US)

(72) Inventors: Jackson Chung Peng Kong, Tanjung Tokong (MY); Bok Eng Cheah, Gelugor (MY); Seok Ling Lim, Kulim (MY); Kooi Chi Ooi, Bukit Gambir (MY); Jenny Shio Yin Ong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 17/971,442

(22) Filed: Oct. 21, 2022

(65) Prior Publication Data

US 2023/0120513 A1 Apr. 20, 2023

(51) Int. Cl.

*H05K 1/11* (2006.01)
*H05K 1/14* (2006.01)
*H05K 1/189* (2026.01)

(52) U.S. Cl.

CPC .............. *H05K 1/118* (2013.01); *H05K 1/111* (2013.01); *H05K 1/141* (2013.01); *H05K 1/147* (2013.01);

(Continued)

(58) Field of Classification Search

CPC .................... H05K 1/118; H05K 1/111; H05K 2201/09372; H05K 2201/10159;

(Continued)

(56) References Cited

U.S. PATENT DOCUMENTS 5,519,578 A * 5/1996 Fujii ...................... H05K 1/189 174/362
5,926,369 A * 7/1999 Ingraham .............. H10W 90/00 361/752

(Continued)

FOREIGN PATENT DOCUMENTS

CN 101452324 B 6/2009
CN 109683077 A 4/2019

(Continued)

OTHER PUBLICATIONS

Dell's DDR5 CAMM Appears in More Detail_ TheLostSwede_ Apr. 1-15, 2022.

(Continued)

*Primary Examiner* — Steven T Sawyer
(74) *Attorney, Agent, or Firm* — Compass IP Law PC

(57) ABSTRACT

Foldable Compression Attached Memory Modules (fCAMMs) and associated apparatus, assemblies and systems. The fCAMM comprises a compression contact module having a plurality of contact means arranged in one or more arrays on its underside, first and second fold modules including multiple memory devices, and flexible interconnects coupling the compression contact module to the first and second fold modules. Under one assembled configuration, portions of printed circuit boards (PCBs) for the first and second fold modules are folded over portions of the compression contact module. Under another configuration, the first fold module is disposed above the second fold module, which is disposed above the compression contact module. In an assembly or system including a motherboard, a compression mount technology (CMT) connector or a land grid array (LGA) assembly is disposed between the motherboard and the compression contact module. Bolster plates (Continued)

are used to urge the compression contact module toward the motherboard.

15 Claims, 11 Drawing Sheets

(52) U.S. Cl.
CPC ....... *H05K 1/189* (2013.01); *H05K 2201/042* (2013.01); *H05K 2201/09372* (2013.01); *H05K 2201/10159* (2013.01); *H05K 2201/10598* (2013.01)

(58) Field of Classification Search
CPC ... H05K 2201/10598; H05K 2201/042; H05K 2201/056; H05K 1/141; H05K 1/189; H05K 1/147; G11C 2207/105; G11C 5/04; G11C 5/06; G06F 1/185
See application file for complete search history.

(56) References Cited

U.S. PATENT DOCUMENTS

| | | | |
|---|---|---|---|
| 5,959,370 | A | 9/1999 | Pardo |
| 6,241,531 | B1 | 6/2001 | Roath et al. |
| 6,354,844 | B1 | 3/2002 | Coico et al. |
| 6,979,784 | B1 | 12/2005 | Duley |
| 7,427,809 | B2 | 9/2008 | Salmon |
| 8,094,455 | B2 | 1/2012 | Hong-Chi |
| 8,282,402 | B2 | 10/2012 | Ngo |
| 8,690,589 | B2 | 4/2014 | Ngo |
| 9,536,593 | B1 | 1/2017 | Peterson et al. |
| 9,575,519 | B2 | 2/2017 | Yin et al. |
| 11,074,952 | B1 | 7/2021 | Schnell et al. |
| 11,321,009 | B2 | 5/2022 | Schnell et al. |
| 11,394,141 | B2 | 7/2022 | Schnell et al. |
| 12,349,274 | B2 | 7/2025 | Rao et al. |
| 2003/0231476 | A1 | 12/2003 | Vinson et al. |
| 2005/0245105 | A1 | 11/2005 | Driscoll et al. |
| 2008/0254657 | A1 | 10/2008 | Sun et al. |
| 2011/0151701 | A1 | 6/2011 | Ngo |
| 2011/0226462 | A1 | 9/2011 | Sato et al. |
| 2013/0005190 | A1 | 1/2013 | Blanchfield et al. |
| 2013/0039016 | A1 | 2/2013 | Wu et al. |
| 2013/0055192 | A1 | 2/2013 | Colbert et al. |
| 2013/0094167 | A1 | 4/2013 | Chen et al. |
| 2015/0171535 | A1 | 6/2015 | Li et al. |
| 2015/0261265 | A1* | 9/2015 | Dean ......................... G06F 1/20 361/679.46 |
| 2016/0056560 | A1 | 2/2016 | Farkas et al. |
| 2016/0170928 | A1 | 6/2016 | Tamarkin et al. |
| 2017/0069369 | A1 | 3/2017 | Kim et al. |
| 2017/0286353 | A1 | 10/2017 | Tamarkin et al. |
| 2019/0051641 | A1 | 2/2019 | Lee et al. |
| 2019/0052008 | A1 | 2/2019 | Consoli et al. |
| 2019/0114109 | A1 | 4/2019 | Arora et al. |
| 2019/0206827 | A1 | 7/2019 | Eskandar |
| 2020/0019519 | A1 | 1/2020 | Johnson et al. |
| 2020/0383207 | A1* | 12/2020 | Leigh ...................... G06F 1/186 |
| 2020/0388598 | A1 | 12/2020 | Azeroual et al. |
| 2021/0321516 | A1 | 10/2021 | Rao et al. |
| 2021/0349144 | A1 | 11/2021 | Zhang |
| 2021/0374056 | A1 | 12/2021 | Malladi et al. |
| 2021/0408704 | A1 | 12/2021 | Li et al. |
| 2022/0027078 | A1 | 1/2022 | Schnell et al. |
| 2022/0028848 | A1 | 1/2022 | Baek |
| 2022/0344309 | A1 | 10/2022 | Schnell et al. |
| 2022/0360002 | A1 | 11/2022 | Li et al. |
| 2022/0361328 | A1 | 11/2022 | Li et al. |
| 2022/0394853 | A1 | 12/2022 | Shi et al. |
| 2023/0005882 | A1 | 1/2023 | Vergis et al. |
| 2023/0007775 | A1 | 1/2023 | Li et al. |
| 2023/0120513 | A1 | 4/2023 | Kong et al. |
| 2023/0353151 | A1 | 11/2023 | Lee et al. |
| 2024/0364037 | A1 | 10/2024 | Hanks et al. |

FOREIGN PATENT DOCUMENTS

| | | | |
|---|---|---|---|
| CN | 113059811 | A | 7/2021 |
| JP | 3208606 | B2 | 9/2001 |
| WO | 9616532 | A1 | 5/1996 |

OTHER PUBLICATIONS

Extended European Search Report for Patent Application No. 23170057.6, Mailed Oct. 31, 2023, 8 pages.
Final Office Action for U.S. Appl. No. 17/871,686, Mailed Nov. 12, 2025, 23 pages.
First Office Action for U.S. Appl. No. 17/354,540, Mailed Aug. 13, 2024, 16 pages.
First Office Action for U.S. Appl. No. 17/871,542, Mailed Aug. 6, 2025, 29 pages.
First Office Action for U.S. Appl. No. 17/871,611, Mailed Oct. 1, 2025, 12 pages.
First Office Action for U.S. Appl. No. 17/871,686, Mailed Aug. 6, 2025, 21 pages.
First Office Action for U.S. Appl. No. 17/902,740, Mailed Nov. 5, 2025, 11 pages.
Intel compression mount technology—An overview—_Underfox_ Dec. 1 to 10, 2024.
Notice of Allowance for U.S. Appl. No. 17/354,540, Mailed Mar. 24, 2025, 8 pages.
Notice of Allowance for U.S. Appl. No. 17/871,542, Mailed Nov. 25, 2025, 15 pages.

* cited by examiner

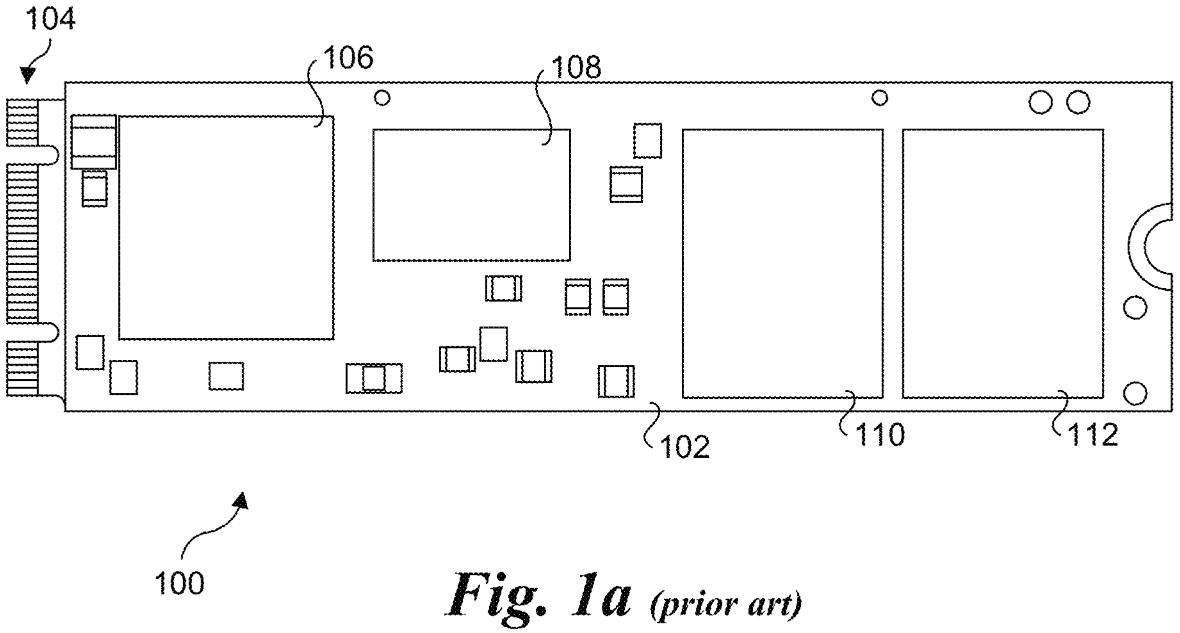
*Fig. 1a* *(prior art)*
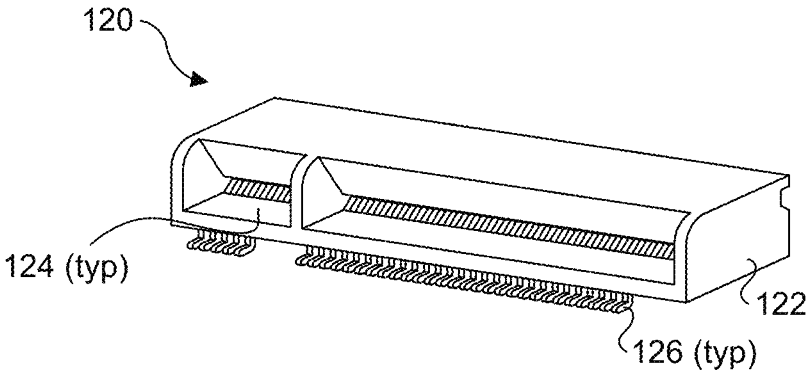
*Fig. 1b* *(prior art)*

FOLDABLE COMPRESSION ATTACHED MEMORY MODULE (fCAMM)

BACKGROUND INFORMATION

Edge connectors are widely used for add-in cards (AICs) in high-speed differential I/O (input/output) applications. For example, most desktop computers include multiple PCIe (Peripheral Component Interconnect Express) expansion slots with connectors mounted to the motherboard that are configured to interface with edge connectors on PCIe AICs (also referred to as expansions cards). This PCIe connectors are mounted perpendicular to the motherboard PCB (printed circuit board). Edge connectors of various configurations are also used to connect memory modules, such as DDR (Double Data Rate) DRAM Dual Inline Memory Modules (DIMMs) and Small Outline Dual Inline Memory Modules (SO DIMMs).

Laptop and notebook computers have limited space for AICs and DIMMs. To address this, PCI-SIG (Special Interest Group), the PCIe standards body, developed and standardized the PCIe M.2 card edge (commonly referred to a M dot 2) and mating PCIe M.2 connector, which is a right-angle connector that enables the AIC to be installed parallel to the motherboard. Examples of an M.2 edge card 100 and an M.2 connector 120 are shown in FIGS. 1*a* and 1*b*.

M.2 edge card 100 includes a PCB 102 including an PCIe M.2 edge connector 104. Various integrated circuits (aka chips) and other electronic components are mounted to PCB 102, including a memory controller chip 106, a DRAM memory chip 108, and a pair of nonvolatile (NV) memory chips 110 and 112. PCIe M.2 edge connector has a Key B+M form factor with pins on a single side (the top side of SSD edge card 100 in this example).

PCIe M.2 connector 120 includes a body 122 having a slot in which edge contacts 124 are disposed. The edge contacts 124 are electrically coupled to contacts 126, which are soldered to pads in the motherboard PCB (or other type of PCB). When installed in PCIe M.2 connector 120, the pins in PCIe M.2 edge connector are electrically coupled to edge contacts 124, and thus to the pads in the PCB.

The PCIe M.2 connector was designed for PCIe3 and PCI4 (3rd and 4th generation) standards. For high speed I/O, such as PCIe5 (PCIe 5th generation), the M.2 connector shows performance degradation. The connector performance improvement is critical for higher data rate I/O applications. In addition, the pin count of this connector is not scalable with given PCIe edge card form factor, which limit the bandwidth of the card. Similarly, SODIMMs and their associated edge connectors were not designed to meet the performance criteria for the current and future generations of DDR DRAM.

Recently, DDR DRAM memory packaging solutions employing Compression Attached Memory Module (CAMM) technology have been introduced. While CAMM has the performance and upgradability advantages, it has its trade-off of potentially impeding the system miniaturization effort. For example, the size of CAMM modules tend to increase proportionally with the amount of memory installed on the modules (for a given DDR DRAM generation and DRAM package).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 1*a* shows an NVMe SSD card including a PCIe M.2 edge connector;

FIG. 1*b* shows a right-angle PCIe M.2 connector;

DETAILED DESCRIPTION

Figure 2A:
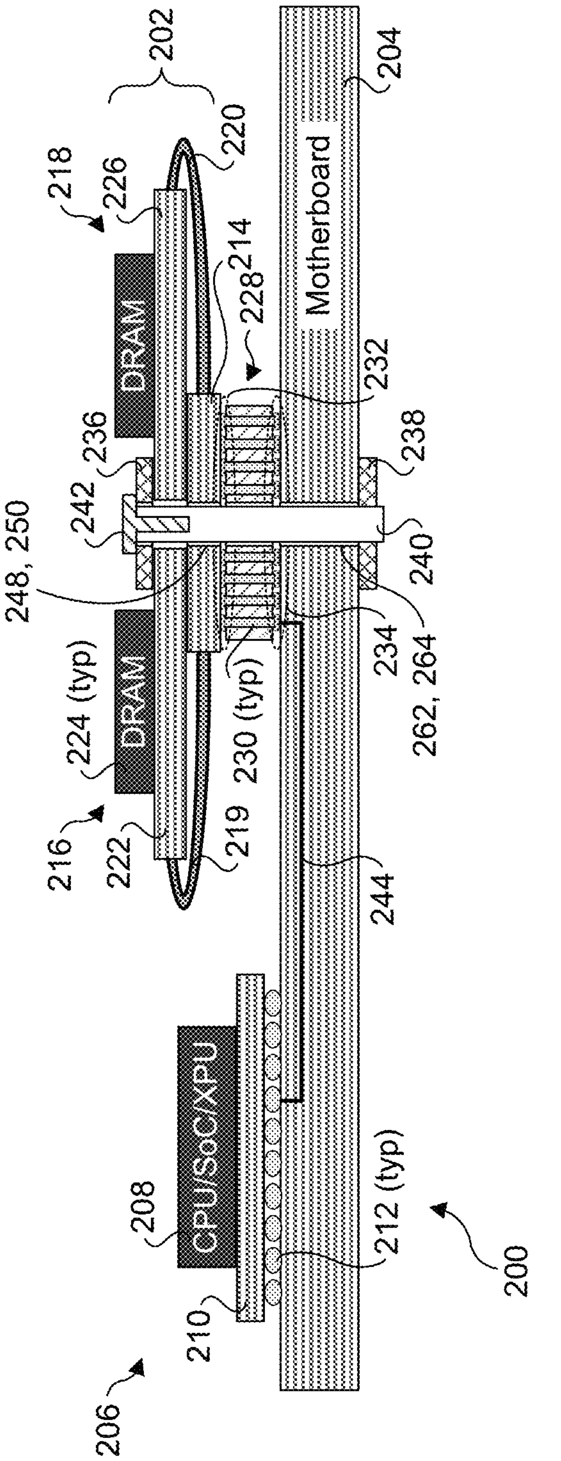
FIG. 2*a* is a cross section view of a system including a first fCAMM configuration taken along the cut line A-A in FIG. 2*b;*

Embodiments of foldable Compression Attached Memory Modules (fCAMMs) and associated apparatus, assemblies and systems are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc. Also, in the Figures herein components that share the same reference numbers in multiple figures refer to the same component or a similar component when the Figures illustrate different embodiments, such as different systems, assemblies, etc.

Figure 2B:
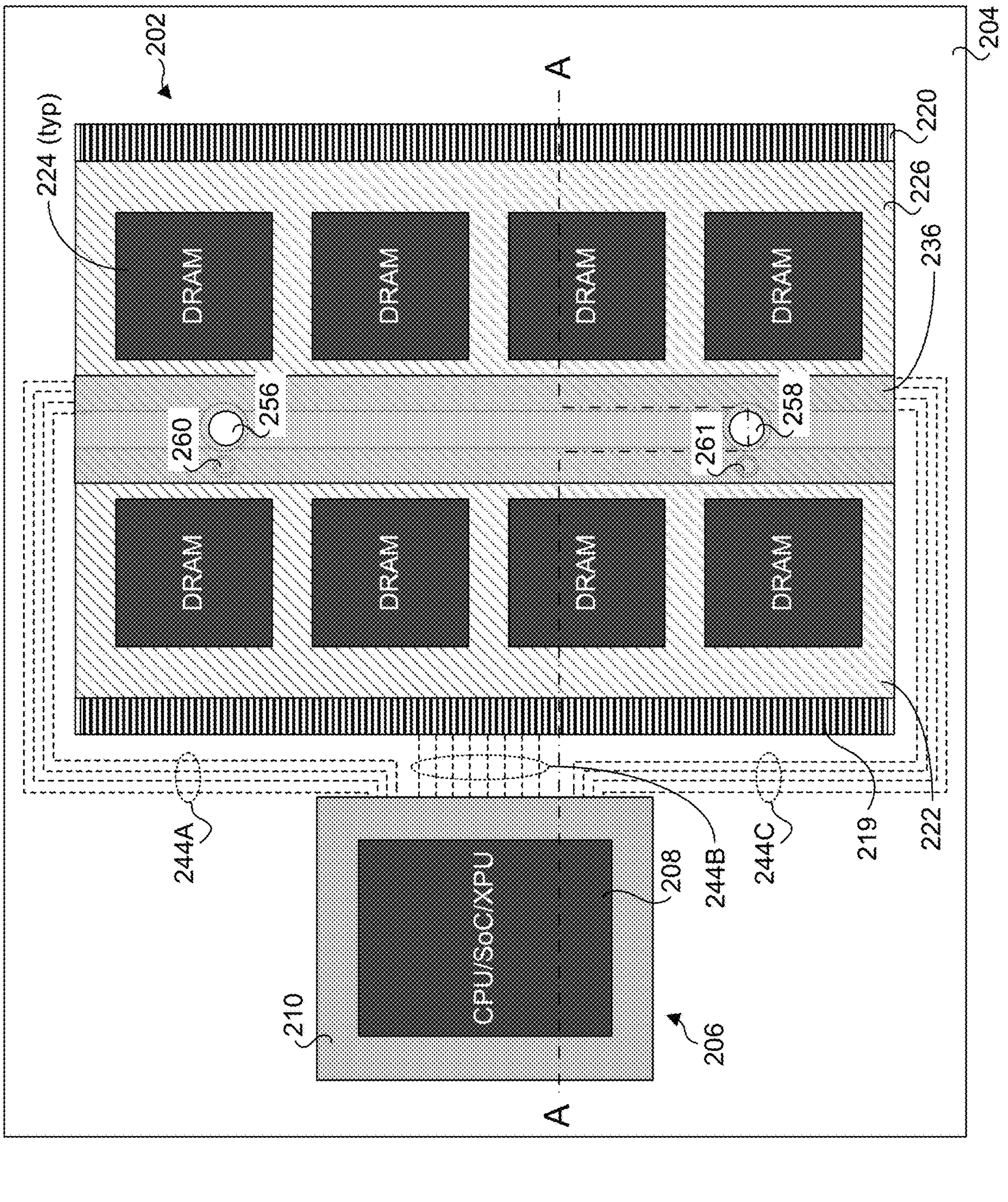
FIG. 2*b* shows a plan view of the system of FIG. 2*a;*

FIGS. 2*a* and 2*b* respectively show cross-section and plan views of a system 200 employing a first embodiment of an fCAMM 202. The cross-section is taken along path A-A shown in FIG. 2*b*. In addition to fCAMM 202, system 200 includes a printed circuit board (PCB) depicted as a motherboard 204 to which a CPU (Central Processing Unit), System on a Chip (SoC), or "other processing unit" (XPU) package 206 is mounted. CPU/SoC/XPU package 206 includes a CPU, SoC, or XPU die, chip, or multi-chip module 208 mounted to a substrate 210 that is mounted to motherboard 204 via a ball grid array (BGA) as depicted by solder balls 212. In other embodiments, substrate 210 may comprise a pin grid array (PGA) or a land grid array (LGA), with a mating PGA socket or LGA socket disposed on the top surface of motherboard 204. Alternatively, the LGA may be mounted to motherboard 204, with the LGA socket coupled to substrate 210.

fCAMM 202 includes a compression contact module 214 coupled to first and second fold modules 216 and 218 via first and second flexible interconnects 219 and 220. Fold module 216 includes a PCB 222 to which a plurality of DRAM devices 224 are mounted, while fold module 218 includes a PCB 226 to which a plurality of DRAM devices 224 are likewise mounted.

A CMT (contact mount technology) connector 228 is disposed between compression contact module 214 and motherboard 204. CMT connector 228 includes an array of spring-loaded CMT contacts 230 (which may also be referred to as CMT pins) that are respectively coupled to CMT contact pads in a first array of CMT contact pads 232 disposed on the underside of compression contact module 214 and a second array of CMT contact pads 234 disposed on the top surface of motherboard 204.

Figure 5A:
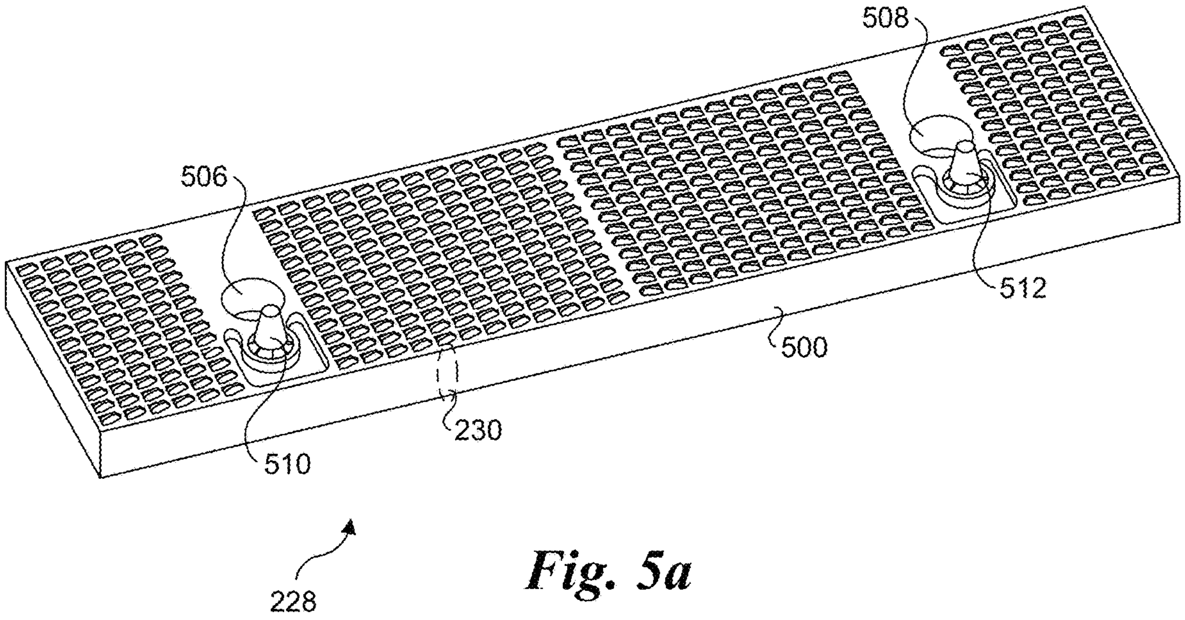
FIG. 5*a* shows a 3D view of a CMT connector, according to one embodiment
Figure 5B:
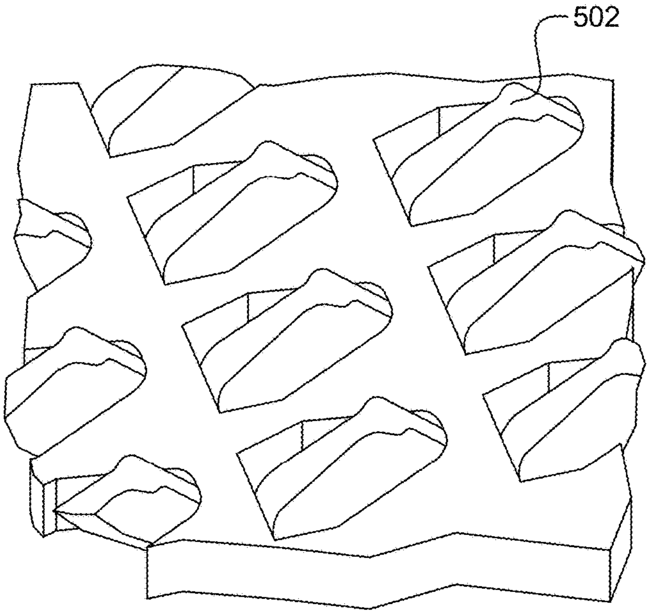
FIG. 5*b* shows a close-up view of the top of the spring contact structure used for the CMT pins.
Figure 5C:
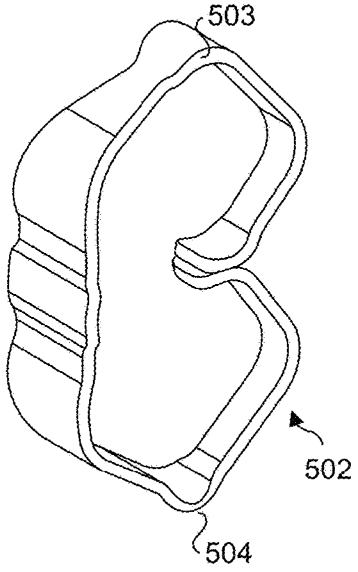
FIG. 5*c* shows a 3D view of a spring contact used for the CMT pins, according to one embodiment.

Under the orientation shown in FIG. 2*a*, CMT connector 228 works by applying a downward force to compression contact module 214, which urges CMT contact pads 232 into compression contact with upper lobes on CMT contacts 230, while CMT contact pads 234 are urged into compression contact with lower lobes on CMT contacts 230. Further details of an exemplary CMT connector and CMT contacts are shown in FIGS. 5*a*-5*c* below.

To effect the downward compression force a pair of upper and lower bolster plates 236 and 238 are used. Lower bolster plate 238 is disposed on the bottom surface of motherboard 204, while upper bolster plate 236 is disposed above PCBs 222 and 226. In the illustrated embodiment, a pair of internally threaded standoffs 240 (one is shown in this view) are coupled to lower bolster plate 238 (e.g., integrally manufactured such that the lower bolster plate and the two internally threaded standoff are a single piece). A pair of screws 242 are threaded into the threaded portion of internally threaded standoffs 240. In another embodiment, a bolt is used that is either threaded into a threaded insert in lower bolster plate 238 (e.g., a KEENSERT™ or the like), or the bolt is threaded into a nut disposed below lower bolster plate 238.

Generally, "wiring" in the motherboard PCB and the PCBs (or substrates) used for compression contact module 214 and fold modules 216 and 218 is used to interconnect "pins" on CPU/SoC package 206 (in this illustrated example solder balls 212) to "pins" on DRAM devices 224. Generally, DRAM devices 224 comprise a DRAM package or "chip" with some means for coupling signals from the DRAM die to the PCB to which the DRAM device is mounted. For example, DRAM devices may employ BGAs in some embodiments, or may employ an array of BGA pads with the BGA solder balls formed on the PCB. The "wiring" generally comprises via and circuit traces formed in various layers in the PCBs, as illustrated by a routing trace 244. Similar routing traces would be used in the PCB/substrate for compression contact module 214 to couple CMT contact pads 232 to first ends of flexible interconnects 219 and 220 and routing traces in PCBs 222 and 226 would be used to the couple second ends of flexible interconnects 219 and 220 to "pins" on DRAM devices 224.

Figure 2C:
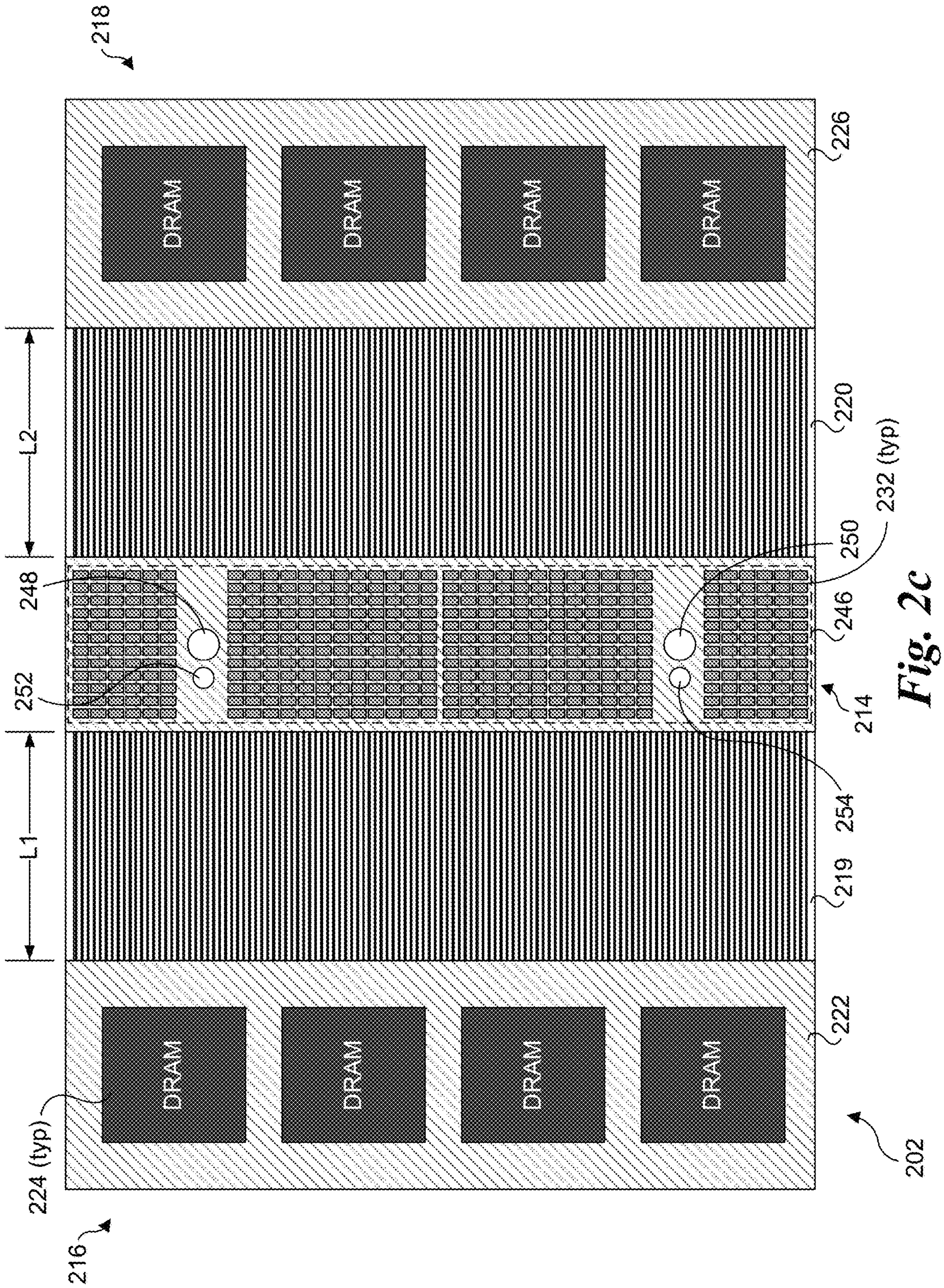
FIG. 2*c* shows an underside plan view of the fCAMM of FIGS. 2*a* and 2*b* when the fCAMM is unfolded.

FIG. 2*c* shows an underside plan view of an unfolded fCAMM 202. One or more arrays 246 of CMT contact pads 232 are patterned on the PCB/substrate for compression contact module 214. A pair of clearance holes 248 and 250 are formed in the PCB/substrate for compression contact module 214, along with a pair of alignment holes 252 and 254. Clearance holes 248 and 250 have diameters sized to a small amount of clearance with internally threaded standoffs 240 (or bolts), while alignment holes 252 and 254 are sized for mating alignment pins in CMT connector 228.

As further shown in FIG. 2*c*, flexible interconnect 219 has a length L1 and flexible interconnect 220 has a length L2. In the illustrated embodiment, L1=L2. In other embodiments, L1 may be less than or greater than L2.

As shown in FIG. 2*b*, clearance holes 256 and 258 are formed upper bolster plate 236. Upper bolster plate 236 may also include an optional pair of alignment holes 260 and 262. Optionally, alignment holes 260 and 262 may be replaced with alignment pins. FIG. 2*b* further shows sets of routing traces 244A, 244B, and 244C that are formed in the PCB for motherboard 204 and are used to couple "pins" on CPU/SoC/XPU package 206 to CMT contact pads 234 (not shown in FIG. 2*b*) on motherboard 204. In practice, the routing traces would be more direct rather than what is shown, which is for illustrative purposes to convey that some of the routing traces would go to CMT contact pads 234 to be used for connection (via compression contact module 214 and flexible interconnect 220) to PCB 226.

Figure 2D:
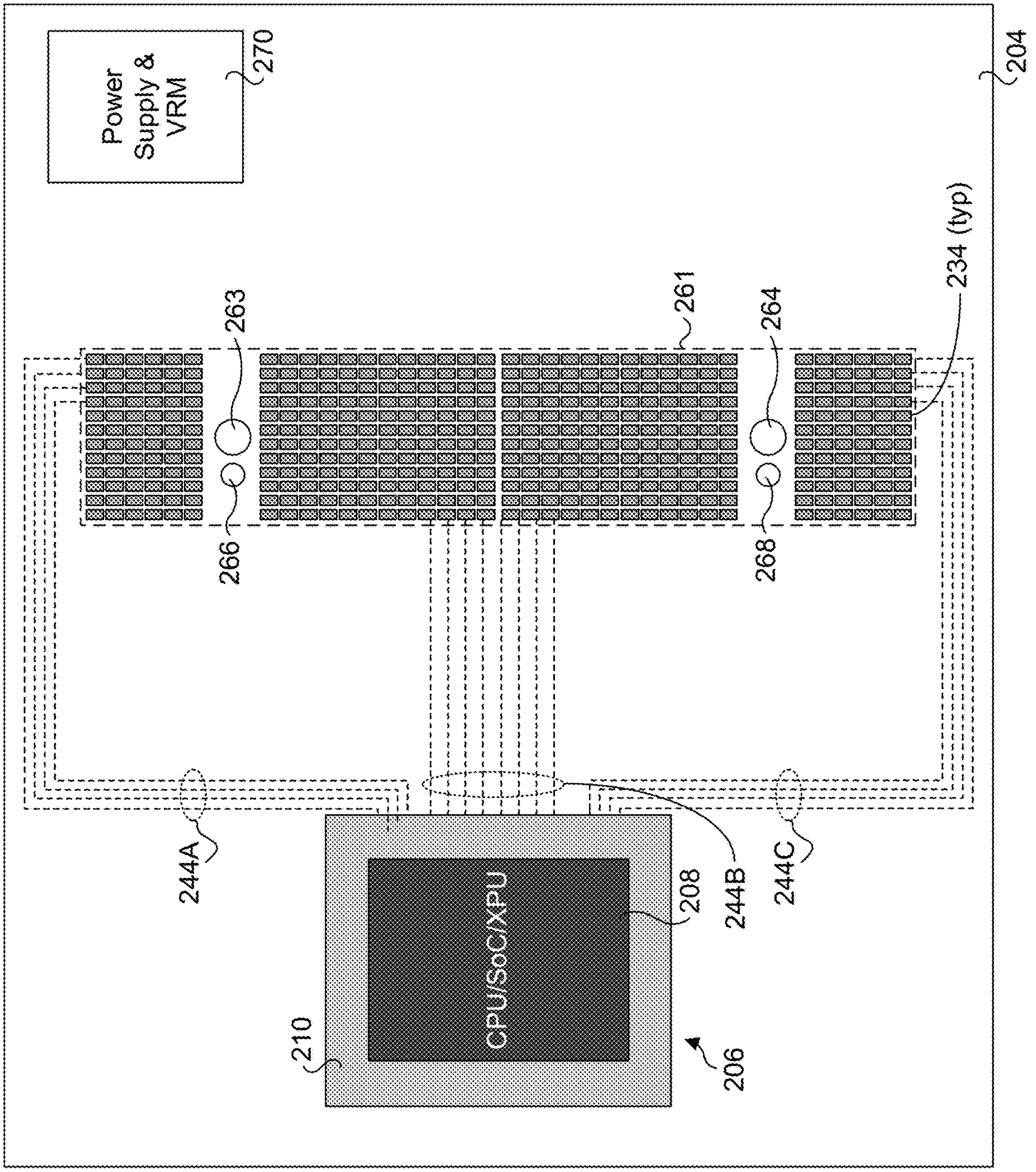
FIG. 2*d* shows a plan view of the motherboard for the system of FIGS. 2*a* and 2*b;*

FIG. 2*d* shows a plan view of motherboard 204 with CPU/SoC/XPU package 206. CMT contact pads 234 are patterned on the motherboard to have one or more arrays 261 matching the one of more arrays 246 shown in FIG. 2*c*. A pair of clearance holes 263 and 264 are formed in motherboard 204 having a configuration aligned with clearance holes 248 and 250. Likewise, a pair of alignment holes 266 and 268 are formed in motherboard 204 having a configuration may be aligned with alignment holes 252 and 254 of FIG. 2*c*. Optional as the alignment pins on 228 (top/bottom) may be configured differently between the interface with 214 (compression module) and the interface with 204 (PCB). FIG. 2*d* also shows sets of routing traces 244A, 244B, and 244C that are routed to CMT contact pads 234 in the one or more arrays 260. As with above, in practice these routing traces would be routed more directly.

In addition to routing traces coupling pins on CPU/SoC/XPU 210 to CMT contact pads 234, portions of the CMT contact pads will be coupled to a ground plane and one or more voltage lines provided by a power supply and voltage regulation module (VRM) 270. Generally, the power supply may be mounted to the motherboard or be separate and provide voltage input(s) to one or more VRMs. The one or more VRMs provide output voltages that are coupled to groups of CMT contact pads 234 that are used to provide input power to various circuitry in fCAMM 202.

Figure 2E:
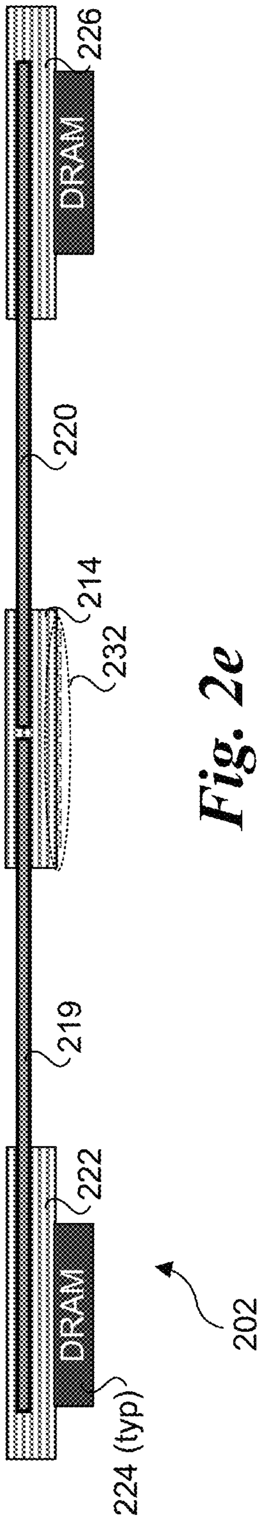
FIG. 2*e* shows a cross-section view illustrating the structure of the fCAMM of FIG. 2*c*, according to one embodiment.

FIG. 2*e* shows a cross-section side view of the unfolded fCAMM 202 shown in FIG. 2*c*. In this embodiment, the flexible interconnects 219 and 220 comprise one or more layers spanning across PCB 222, the PCB for compression contact module 214, and PCB 226. In accordance with aspects of respective embodiments, the flexible interconnects described and illustrated herein, including flexible interconnects 219 and 220 comprise a polyimide, a polyamide, or a silicone layer. Other types of flexible interconnect may also be used that are fabricate separately and attached to the fCAMM PCBs, such flex cables that employ soldered, edge, or pinned connections.

Generally, the PCBs described and illustrated herein may employ known PCB structures. For example, such PCBs may be organic or ceramic-based PCBs.

In addition to using an interposed CMT connector, such as CMT connector 228, other means may be used to couple signals from a motherboard to a compression contact module. For example, in the embodiment of a system 300 illustrated in FIGS. 3*a*, 3*b*, and 3*c*, a land grid array (LGA) connector assembly 304 is used to couple signals and voltages between a motherboard 204 and a compression contact module 314 of an fCAMM 302. As before, system 300 includes upper and lower bolster plates 236 and 238, along with an internally threaded standoff 240A and a screw 242, with the upper and lower bolster plates 236 and 238 plates compressing the LGA contacts against mating LGA pads when screw 242 is threaded into the internal threads of internally threaded standoff 240A.

Figure 3C:
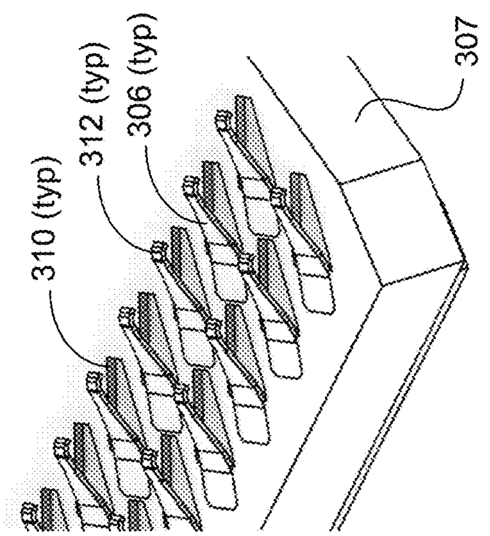
FIGS. 3*b* and 3*c* show detailed views of the LGA assembly used in the system of FIG. 3*a*; is a FIG. 4*a* shows a cross-section view of a system including a second CAMM configuration under which the fold modules are stacked above the compression contact module.
Figure 3B:
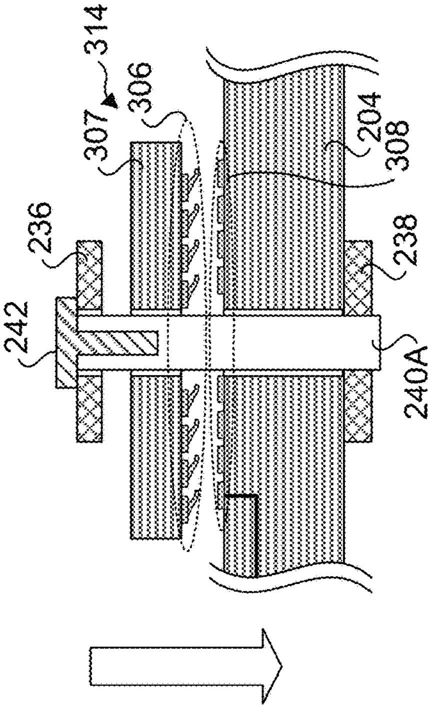

As shown in the detailed views of FIGS. 3*b* and 3*c*, the LGA connector assembly includes an LGA comprising one or more arrays of LGA contacts 306 (which also may be referred to as LGA pins) coupled to one of the mating components (a PCB 307 for compression contact module 314 in the illustrated embodiment), while one or more matching arrays of LGA contact pads 308 are patterned on the other mating component (motherboard 204 in the illustrated embodiment). Under another configuration, the LGA contact may be on the motherboard and the LGA contact pads on the PCB for the compression contact module.

As shown in FIG. 3*c*, the LGA comprises multiple columns (or rows) of LGA contacts 306 that are coupled to the underside of PCB 307. There is a recess 310 for each LGA contact 306 formed in PCB 307. In the illustrated embodiment, an LGA contact 306 is a cantilevered leaf spring with a "fishbone" shape including a lob 312 that is in contact with mating LGA contact pad on the motherboard when the LGA connector assembly 304 is assembled. The "fishbone" shape illustrated in FIG. 3*c* is exemplary and is not limiting, as other LGA and LGA contact/pin structures may be used.

Figure 4A:
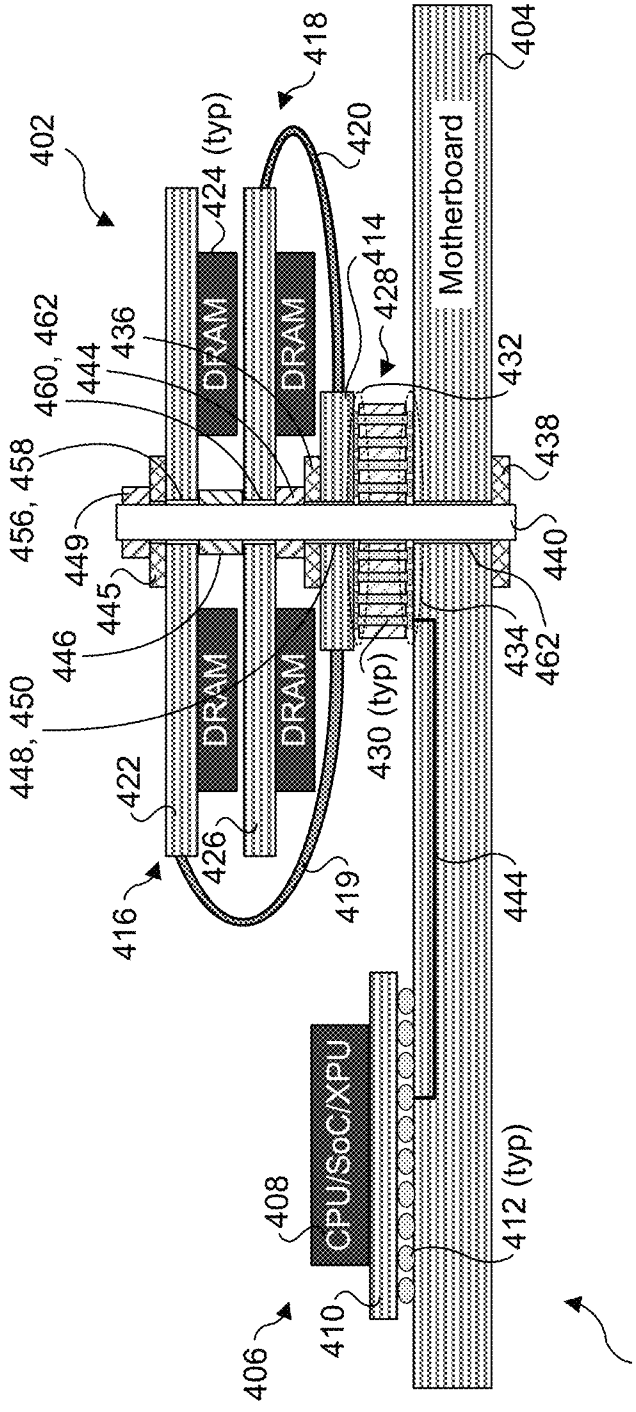
FIG. 4*b* shows an underside plan view of the fCAMM of FIG. 4*a* when the fCAMM is unfolded.

FIG. 4*a* shows a cross-section view of a second embodiment of a system 400 including a stacked fCAMM 402. System 400 includes a motherboard 404 to which a CPU/SoC/XPU package 406 is mounted. Similar to CPU/SoC/XPU package 206, CPU/SoC/XPU package 406 includes a CPU, SoC, or XPU die, chip, or multi-chip module 408 mounted to a substrate 410 that is mounted to motherboard 404 via a ball grid array (BGA) as depicted by solder balls 412. In other embodiments, substrate 410 may a PGA or an LGA, with a mating PGA socket or LGA socket disposed on the top surface of motherboard 404. Alternatively, the LGA may be mounted to motherboard 404, with the LGA socket coupled to substrate 410.

fCAMM 402 includes a compression contact module 414 coupled to first and second fold modules 416 and 418 via first and second flexible interconnects 419 and 420. Fold module 416 includes a PCB 422 to which two columns of DRAM devices 424 are mounted, while fold module 418 includes a PCB 426 to which two columns of DRAM devices 424 are likewise mounted.

A CMT connector 428 is disposed between compression contact module 414 and motherboard 404. CMT connector 428 includes an array of spring-loaded CMT contacts 430 that are respectively coupled to CMT contact pads in a first array of CMT contact pads 432 disposed on the underside of compression contact module 414 and a second array of CMT contact pads 434 disposed on the top surface of motherboard 404.

System 400 includes an upper bolster plate 445, a compression contact module bolster plate 436, and a lower bolster plate 438 to which a pair of externally threaded standoffs 440 are coupled (e.g., integrally coupled to form a single piece in one embodiment). Other components (for each of externally threaded standoffs 440) include a lower nut 444, a spacer 446, and an upper nut 449. As an option, a pair of bolts with a sufficient thread length may be used in place of a threaded standoffs, noting in this instance the bolts would be inserted through clearance holes in the lower bolster plate rather than be a single piece.

Figure 4B:
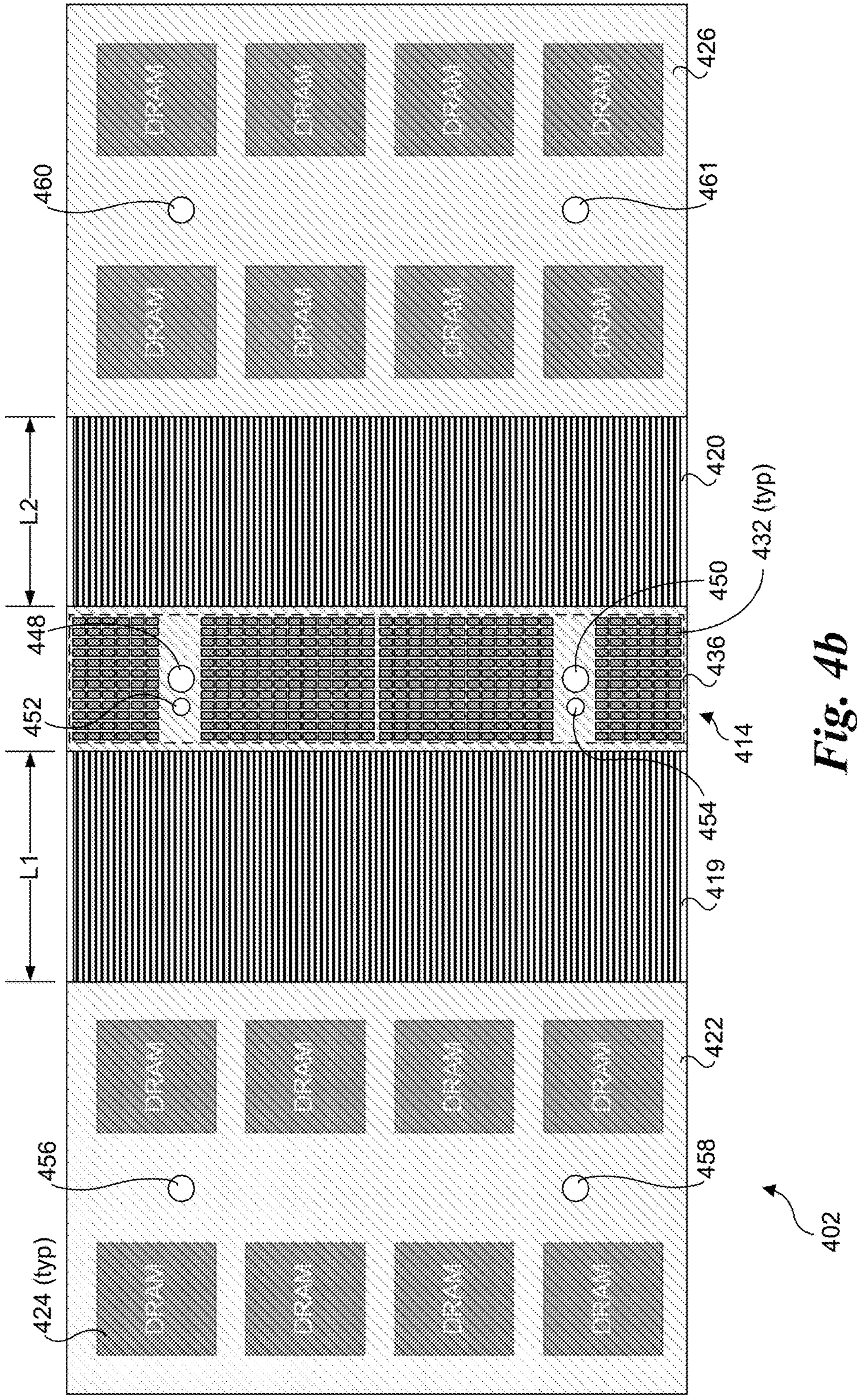

FIG. 4*b* shows an underside plan view of an unfolded fCAMM 402. One or more arrays 436 of CMT contact pads 432 are patterned on the PCB/substrate for compression contact module 414. Contact pads 432 would be patterned on the top surface of motherboard 404 using a matching pattern or one or more arrays. A pair of clearance holes 448 and 450 are formed in the PCB/substrate for compression contact module 414, along with a pair of alignment holes 452 and 454. Clearance holes 448 and 450 have diameters sized to a small amount of clearance with externally threaded standoffs 440, while alignment holes 452 and 454 are sized for mating alignment pins in CMT connector 428. There are also a pair of clearance holes 456 and 458 formed in PCB 422 and a pair of clearance holes 460 and 461 formed in PCB 426.

As further shown in FIG. 4*b*, flexible interconnect 419 has a length L1 and flexible interconnect 420 has a length L2. In the illustrated embodiment of FIGS. 4*a* and 4*b*, L1 is greater than L2. L1 and L2 should be long enough to enable the upper portion of threaded standoffs 440 to pass through clearance holes 456 and 458 of PCB 422 and to pass through clearance holes 460 and 461 of PCB 426 during assembly.

In an aspect, compression contact module 414 may include a first width, PCB 422 may include a second width and PCB 426 may include a third width. In an aspect shown in FIGS. 4*a*/4*b*, the first width may be lesser than the second and third width.

Alternatively, the first width may be configured to be equivalent or larger than the respective second and third widths, for example, to accommodate increased number of arrays 436 of CMT contact pads 432 for improved functionality; respective L1/L2 may be further reduced accordingly.

During assemble, the externally threaded standoffs are passed through a pair of clearance holes 462 in motherboard 404, which has a plan view configuration similar to motherboard 204 shown in FIG. 2*d* discussed above. Next, CMT connector 428 is installed above the array of CMT contact pads 434 on motherboard 402, with the pair of externally threaded contacts passing through clearance holes in the CMT connector (see FIG. 5*a* below), followed by installation of compression module 414, which has a configuration like compression contact module 214 shown in FIG. 2*c* including a pair of clearance holes 248 and 250 and a pair of alignment holes 252 and 254. Compression contact module bolster plate 436, which likewise has a pair of clearance holes through which externally threaded standoffs 440 pass, is installed above compression contact module 414. The pair of lower nuts 444 are then threaded onto the threads on the externally threaded standoffs 440 until a sufficient force is applied to the top of compression contact module bolster plate 436 to cause the contacts 430 in CMT connector 428 to be in compression contact with contact pads 432 and 434.

Next, fold module 418 is installed by flipping the fold module over such that the DRAM devices 424 are on the underside of PCB 426. During installation, the upper portion of externally threaded standoffs 440 pass through clearance holes 460 and 461. Spacers 446 are then slipped over the upper portion of externally threaded standoffs 440. Fold module 416 is then installed by flipping the fold module over such that the DRAM devices 424 are on the underside of PCB 422 with the upper portion of externally threaded standoffs 440 passing through clearance holes 456 and 458 in PCB 422. At this point, upper bolster plate 445 is installed over PCB 422 and upper nut 449 is threaded onto the top portions of externally threaded standoffs 440 until the assembled components are held securely in place.

Figure 3A:
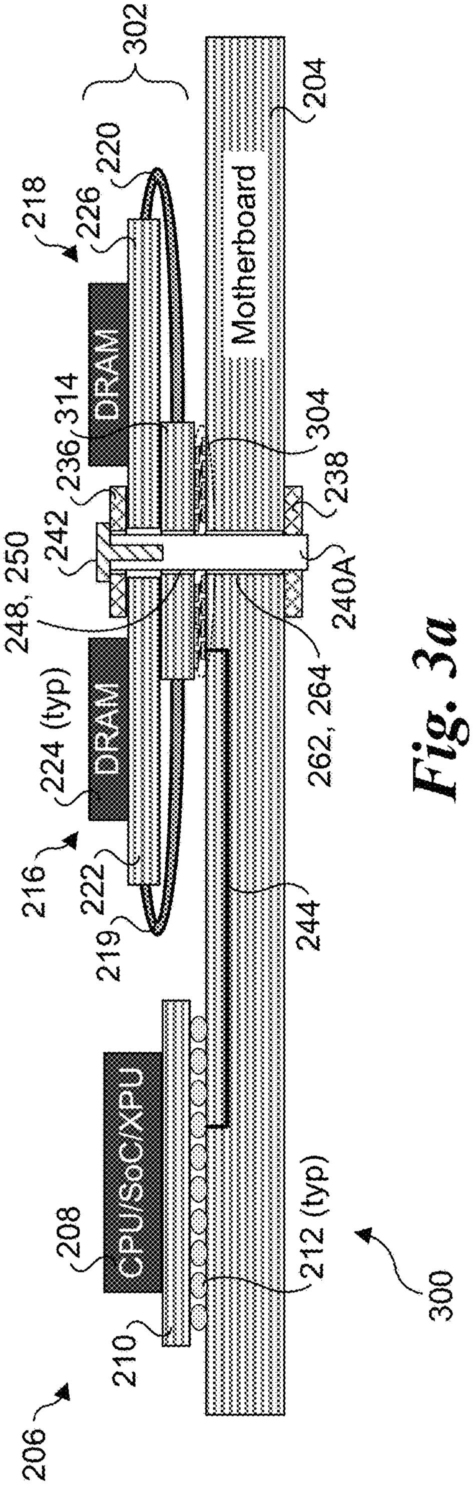
FIG. 3*a* shows a cross-section view of a system comprising a variant of the system of FIGS. 2*a* and 2*b* under which an LGA assembly is used in place of a CMT connector, according to one embodiment.

As with the embodiment shown in FIGS. 3*a*-3*c* above, a LGA assembly may be used in place of CMT connector 428. In this case, the number of LGA contacts and mating contact pads would be increased relative to that number of LGA contacts and mating contact for system 300.

FIG. 5*a* shows a three-dimensional (3D) view of a CMT connector 228, according to one embodiment. CMT connector 228 includes a body 500 in which arrays of CMT pins 230 are installed. As shown in FIGS. 2*b* and 2*c*, the CMT pins include a pair of spring contacts that are installed in opposing ends of tubes that are compressed when CMT connector 228 is installed in systems 200 and 400 shown herein. As shown in FIG. 5*c*, a spring contact 502 comprises a bent structure made of a suitable metal and includes a pair of lobes 503 and 504; when two spring contacts 502 are installed in a tube and the components of system 200 are assembled, lobe 503 will contact a CMT contact pad 232 on compression contact module 214 while lobe 504 will contact a CMT contact pad 234 on motherboard 204. The tubes are disposed in respective holes in body 500, and the spring contacts 502 are inserted into the opposing ends of the tubes.

As further shown in FIG. 5*a*, CMT connector 228 includes two clearance holes 506 and 508 and two alignment pins or alignment dowels 510, and 512. There are mating holes for alignment pins/dowels 510, and 512 in compression contact module 214 that are not shown in FIGS. 2*a* and 4*a*. In some embodiments, alignment pins or dowels protrude outward from both the top and bottom of the CMT connector body, and are used to align the CMT contacts/pins with mating pads on components above and below the CMT connector. Accordingly, motherboard 202 and motherboard 402 would also include a pair of mating alignment holes.

Figure 6:
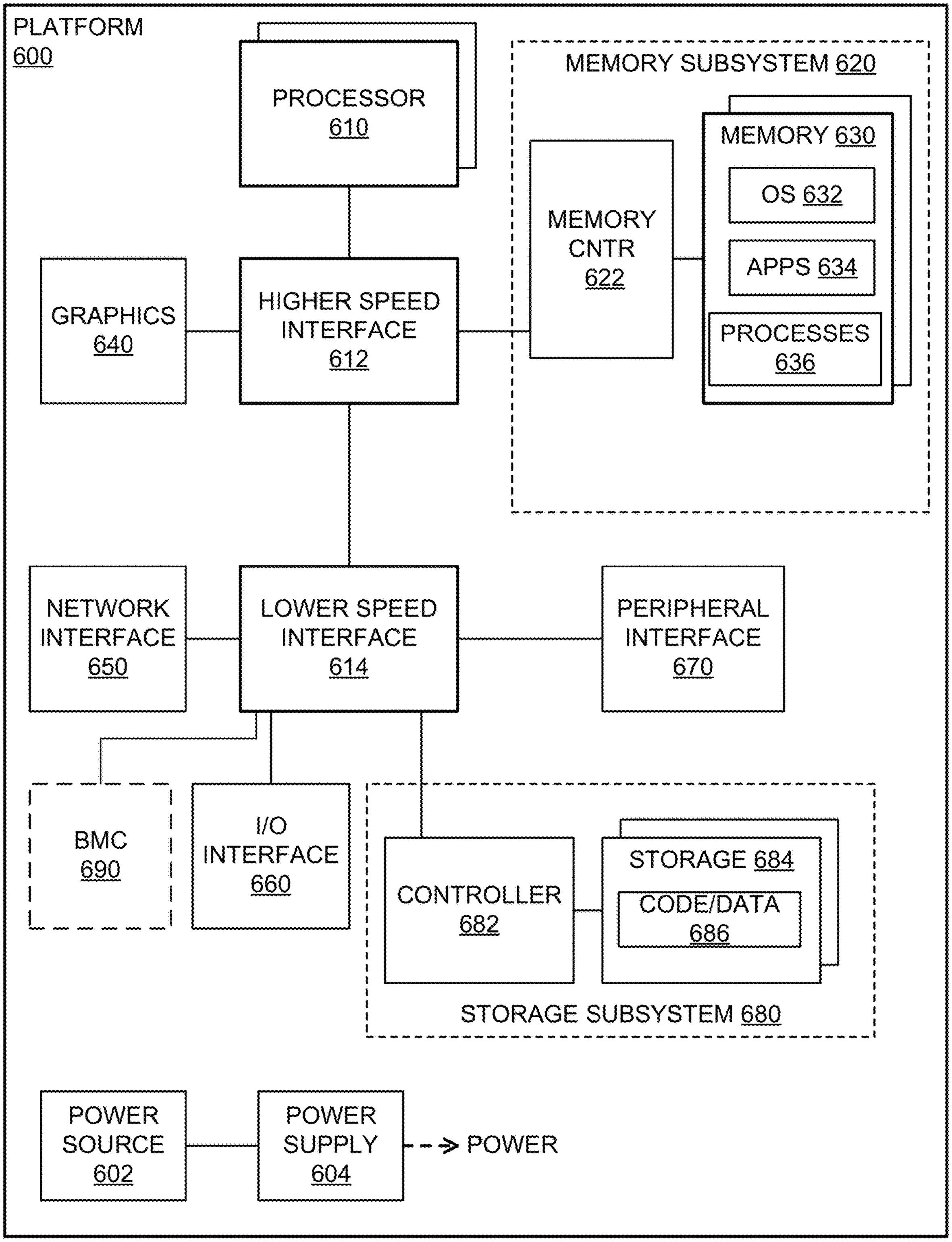
FIG. 6 shows a block diagram of an exemplary compute platform in which embodiments described and illustrated herein may be implemented.

FIG. 6 illustrates an example compute platform 600 in which aspects of the embodiments may be practiced. Compute platform 600 represents a computing device or computing system in accordance with any example described herein, and can be a server, laptop computer, desktop computer, or the like. More generally, compute platform 600 is representative of any type of computing device or system employing one or more fCAMMs.

Compute platform 600 includes a processor 610, which provides processing, operation management, and execution of instructions for compute platform 600. Processor 610 can include any type of microprocessor, CPU, graphics processing unit (GPU), processing core, or other processing hardware to provide processing for compute platform 600, or a combination of processors. Processor 610 may also comprise an SoC or XPU. Processor 610 controls the overall operation of compute platform 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, compute platform 600 includes interface 612 coupled to processor 610, which can represent a higher speed interface or a high throughput interface for system components that needs higher bandwidth connections, such as memory subsystem 620 or graphics interface components 640. Interface 612 represents an interface circuit, which can be a standalone component or integrated onto a processor die. Where present, graphics interface 640 interfaces to graphics components for providing a visual display to a user of compute platform 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both.

Memory subsystem 620 represents the main memory of compute platform 600 and provides storage for code to be executed by processor 610, or data values to be used in executing a routine. Memory 630 of memory subsystem 620 may include one or more memory devices such as DRAM devices, read-only memory (ROM), flash memory, or other memory devices, or a combination of such devices. Memory 630 stores and hosts, among other things, operating system (OS) 632 to provide a software platform for execution of instructions in compute platform 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for compute platform 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610.

While not specifically illustrated, it will be understood that compute platform 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, compute platform 600 includes interface 614, which can be coupled to interface 612. Interface 614 can be a lower speed interface than interface 612. In one example, interface 614 represents an interface circuit, which can include standalone components and integrated circuitry. In one example, multiple user interface components or peripheral components, or both, couple to interface 614. Network interface 650 provides compute platform 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one example, compute platform 600 includes one or more I/O interface(s) 660. I/O interface(s) 660 can include one or more interface components through which a user interacts with compute platform 600 (e.g., audio, alphanumeric, tactile/touch, or other interfacing). Peripheral interface 670 can include any hardware interface not specifically mentioned above. Peripherals refer generally to devices that connect dependently to compute platform 600. A dependent connection is one where compute platform 600 provides the software platform or hardware platform or both on which operation executes, and with which a user interacts.

In one example, compute platform 600 includes storage subsystem 680 to store data in a nonvolatile manner. In one example, in certain system implementations, at least certain components of storage subsystem 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage device(s) 684 holds code or instructions and data 686 in a persistent state (i.e., the value is retained despite interruption of power to compute platform 600). A portion of the code or instructions may comprise platform firmware that is executed on processor 610. Storage device(s) 684 can be generically considered to be a "memory," although memory 630 is typically the executing or operating memory to provide instructions to processor 610. Whereas storage device(s) 684 is nonvolatile, memory 630 can include volatile memory (i.e., the value or state of the data is indeterminate if power is interrupted to compute platform 600). In one example, storage subsystem 680 includes controller 682 to interface with storage device(s) 684. In one example controller 682 is a physical part of interface 614 or processor 610 or can include circuits or logic in both processor 610 and interface 614. In one example, a storage device 684 may comprise an AIC such as an NVMe SSD that is mounted to the motherboard using a CMT connector using the assemble architecture shows in the Figures herein and discussed above.

Compute platform 600 may include an optional Baseboard Management Controller (BMC) 690 that is configured to effect the operations and logic corresponding to the flowcharts disclosed herein. BMC 690 may include a microcontroller or other type of processing element such as a processor core, engine or micro-engine, that is used to execute instructions to effect functionality performed by the BMC. Optionally, another management component (standalone or comprising embedded logic that is part of another component) may be used.

Power source 602 provides power to the components of compute platform 600. More specifically, power source 602 typically interfaces to one or multiple power supplies 604 in compute platform 600 to provide power to the components of compute platform 600. In one example, power supply 604 includes an AC to DC (alternating current to direct current) adapter to plug into a wall outlet. Such AC power can be renewable energy (e.g., solar power) power source 602. In one example, power source 602 includes a DC power source, such as an external AC to DC converter. In one example, power source 602 can include an internal battery or fuel cell source.

Various types of memory may be used in the fCAMMs described and illustrated herein, including standardized memory devices (e.g., chips and/or packages). Such standards include DDR4 (Double Data Rate version 4, initial specification published in September 2012 by JEDEC (Joint Electronic Device Engineering Council). DDR4E (DDR version 4), LPDDR3 (Low Power DDR version 3, JESD209-3B, August 2013 by JEDEC), LPDDR4 (LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013), DDR5 (DDR version 5, JESD79-5A, published October, 2021), DDR version 6 (currently under draft development), LPDDR5, HBM2E, HBM3, and HBM-PIM, or others or combinations of memory technologies, and technologies based on derivatives or extensions of such specifications. The specification for LPDDR6 is currently under development. The JEDEC standards are available at www.jedec.org.

As discussed above, in some embodiment the processors illustrated herein may comprise Other Processing Units (collectively termed XPUs). Examples of XPUs include one or more of Graphic Processor Units (GPUs) or General Purpose GPUs (GP-GPUs), Tensor Processing Units (TPUs), Data Processing Units (DPUs), Infrastructure Processing Units (IPUs), Artificial Intelligence (AI) processors or AI inference units and/or other accelerators, FPGAs and/or other programmable logic (used for compute purposes), etc. While some of the diagrams herein show the use of CPUs, this is merely exemplary and non-limiting. Generally, any type of XPU may be used in place of a CPU in the illustrated embodiments. Moreover, as used in the following claims, the term "processor" is used to generically cover CPUs and various forms of XPUs.

In the foregoing embodiments, the configuration of the arrays used for the CMT connectors and LGAs are exemplary and non-limiting. The number of contacts or pins may be greater than that shown, and the configuration and pitch of the arrays may vary to meet the system requirements. For example, in the case of the system 400, the doubling of DRAM devices relative to system 200 would generally result in the use of more Input/Output (I/O) signals and thus the need for more contacts or pins in the CMT connector and LGA assembly.

It is further noted that the LGA assembly components illustrated in FIGS. 3*a*-3*c* may differ in structure from an LGA used to connect a CPU, SoC, XPU to a motherboard or system board. For instance, some existing processors (SoCs with CPUs) employ LGAs that have a different configuration than that shown in FIGS. 3*a*-3*c*.

The fCAMM and associated assemblies and systems described and illustrated herein provide advantages over current CAMM solutions, including system miniaturization. For example, foldable CAMMs ensure the memory module X and Y dimensions do not grow exponentially with every increment of DRAM density. The increased area would have potentially caused components at the CPU core area, such as bulk power delivery (PD) components (inductors, capacitors), cooling fans, storage and radio M.2 modules to move further out, thus increasing the system footprint. The memory module board layer count may also be reduced, as an fCAMM includes multiple fold modules.

The fCAMM embodiments also provide enhanced signal integrity performance. For instance, they provide reduced signal latency between CPU, SoC, or XPU (e.g., processor) and DRAM memory devices through shorter and less distorted signal transmission path, e.g., direct signal interconnect paths between the processor and the multiple memory devices on both sides of the CAMM connector via the flexible interconnects for reduced signal crosstalk coupling and/or insertion loss.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An apparatus, comprising: a compression contact module comprising a first printed circuit board (PCB) or substrate having a plurality of compression mount technology (CMT) contact pads arranged in one or more arrays on an underside thereof; first and second fold modules, each having a plurality of memory devices coupled to a fold module PCB; a first flexible interconnect coupling the compression contact module to the first fold module; and a second flexible interconnect coupling the compression contact module to the second fold module, wherein the compression contact module, first and second fold modules, and the first and second flexible interconnects provide signal paths between the plurality of CMT contact pads and the plurality of memory devices, and wherein the apparatus is configured to be installed such that portions of the first and second fold modules are folded over the compression contact module, and wherein the compression contact module includes at least two clearance holes that are sized and arranged for respective fastener means passing therethrough when the apparatus is installed, and wherein the compression contact module includes at least two alignment holes that are used to align the one or more arrays of CMT contact pads with one or more mating arrays of contacts for CMT connector.

2. The apparatus of claim 1, wherein the apparatus is configured to be installed such that at least a portion of the first fold module is folded over the compression contact module and at least a portion of the second fold module is folded over the compression contact module and the first fold module.

3. The apparatus of claim 1, wherein at least one of the first and second fold modules includes a plurality of clearance holes that are sized and arranged for respective fastener means passing therethrough when the apparatus is installed.

4. The apparatus of claim 1, wherein the memory devices comprise double data rate $5^{th}$ generation (DDR5) or double data rate $6^{th}$ generation (DDR6) dynamic access random memory (DRAM) devices.

5. The apparatus of claim 1, wherein the compression contact module, first and second interconnects, and the first and second fold modules are integrally formed as a single part.

6. The apparatus of claim 5, wherein the first and second interconnects comprise one or more flexible PCB layers, at a least a portion of the one or more PCB layers are part of PCB structures for the PCB of the compression contact module and the PCBs of the first and second fold modules.

7. An electronic assembly, comprising:

a compression contact module comprising a first printed circuit board (PCB) or substrate having a first plurality of compression mount technology (CMT) contact pads arranged in one or more first arrays on an underside thereof;

first and second fold modules, each having a plurality of memory devices coupled to a fold module PCB;

a first flexible interconnect coupling the compression contact module to the first fold module;

a second flexible interconnect coupling the compression contact module to the second fold module, a motherboard or system board, having a second plurality of CMT contact pads arranged in one or more second arrays on a topside thereof; and a CMT connector, disposed between the compression contact module and the motherboard or system board and including CMT pin in contact with CMT contact pads in the first plurality of CMT contact pads and in the second plurality of CMT contact pads;

an upper bolster plate;

a lower bolster plate; and a plurality of fastening means, wherein respective portions of the first and second fold modules PCBs are folded over the compression contact module, and wherein a plurality of signal paths are provided to enable transfer of signals between CMT contact pads in the second plurality of CMT contact pads and the plurality of memory devices, and wherein the upper bolster plate is disposed above the first and second fold modules and the lower bolster plate is disposed below the motherboard or system board, and wherein the plurality of fastening means are to couple the upper bolster plate to the lower bolster plate to apply a compression force to the CMT connector.

8. The electronic assembly of claim 7, wherein each of the compression contact module and the motherboard or system board have a plurality of clearance holes formed therein arranged in a common pattern, and wherein the plurality of fastening means comprises standoffs or bolts that pass through respective clearance holes in the motherboard or system board and the compression contact module.

9. The electronic assembly of claim 7, wherein the memory devices comprise double data rate $5^{th}$ generation (DDR5) or double data rate $6^{th}$ generation (DDR6) dynamic access random memory (DRAM) devices.

10. An apparatus, comprising:

a compression contact module comprising a first printed circuit board (PCB) or substrate having a plurality of compression mount technology (CMT) contact pads arranged in one or more arrays on an underside thereof;

first and second fold modules, each having a plurality of memory devices coupled to a fold module PCB;

a first flexible interconnect coupling the compression contact module to the first fold module; and a second flexible interconnect coupling the compression contact module to the second fold module, wherein the compression contact module, first and second fold modules, and the first and second interconnects provide signal paths between the plurality of CMT contact pads and the plurality of memory devices, and wherein the apparatus is configured to be installed such that portions of the first and second fold modules are folded over the compression contact module, and wherein at least one of the first and second fold modules includes a plurality of clearance holes that are sized and arranged for respective fastener means passing therethrough when the apparatus is installed.

11. The apparatus of claim 1, wherein the apparatus is configured to be installed such that at least a portion of the first fold module is folded over the compression contact module and at least a portion of the second fold module is folded over the compression contact module and the first fold module.

12. The apparatus of claim 1, wherein at least one of the first and second fold modules includes a plurality of clearance holes that are sized and arranged for respective fastener means passing therethrough when the apparatus is installed.

13. The apparatus of claim 1, wherein the memory devices comprise double data rate $5^{th}$ generation (DDR5) or double data rate $6^{th}$ generation (DDR6) dynamic access random memory (DRAM) devices.

14. The apparatus of claim 1, wherein the compression contact module, first and second interconnects, and the first and second fold modules are integrally formed as a single part.

15. The apparatus of claim 14, wherein the first and second interconnects comprise one or more flexible PCB layers, at a least a portion of the one or more PCB layers are part of PCB structures for the PCB of the compression contact module and the PCBs of the first and second fold modules.

* * * * *